United States Patent
Querbach et al.

(10) Patent No.: US 11,182,158 B2
(45) Date of Patent: Nov. 23, 2021

(54) TECHNOLOGIES FOR PROVIDING ADAPTIVE MEMORY MEDIA MANAGEMENT

(71) Applicant: Intel Corporation, Santa Clara, CA (US)

(72) Inventors: Bruce Querbach, Hillsboro, OR (US); Shigeki Tomishima, Portland, OR (US); Srikanth Srinivasan, Portland, OR (US); Chetan Chauhan, Folsom, CA (US); Rajesh Sundaram, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 16/419,483

(22) Filed: May 22, 2019

(65) Prior Publication Data

US 2019/0272173 A1 Sep. 5, 2019

(51) Int. Cl.
*G06F 12/00* (2006.01)
*G06F 9/30* (2018.01)
*G06F 9/50* (2006.01)

(52) U.S. Cl.
CPC ........ *G06F 9/30036* (2013.01); *G06F 9/3004* (2013.01); *G06F 9/5016* (2013.01)

(58) Field of Classification Search
None
See application file for complete search history.

(56) References Cited

U.S. PATENT DOCUMENTS

| | | | |
|---|---|---|---|
| 8,601,313 B1* | 12/2013 | Horn | G06F 11/108 714/6.32 |
| 2009/0144745 A1* | 6/2009 | Gunnels | G06F 11/3428 718/105 |
| 2015/0143155 A1* | 5/2015 | Cho | G06F 13/287 713/401 |
| 2017/0213581 A1* | 7/2017 | Kim | G11C 7/1072 |
| 2018/0277181 A1* | 9/2018 | Bedeschi | H01L 27/11514 |

OTHER PUBLICATIONS

United States Federal Court of Appeals for the Federal Circuit, *Egenera, inc. V. Cisco System, inc.*, 2019-2015, 2019-2387, Decided Aug. 28, 2020. (Year: 2020).*

* cited by examiner

*Primary Examiner* — Jason W Blust
(74) *Attorney, Agent, or Firm* — Compass IP Law PC

(57) ABSTRACT

Technologies for providing adaptive memory media management include media access circuitry connected to a memory media. The media access circuitry is to receive a request to perform at least one memory access operation to be managed by the media access circuitry. The media access circuitry is further to manage the requested at least one memory access operation, including disabling a memory controller in communication with the media access circuitry from managing the memory media while the at least one requested memory access operation is performed.

20 Claims, 6 Drawing Sheets

TECHNOLOGIES FOR PROVIDING ADAPTIVE MEMORY MEDIA MANAGEMENT

BACKGROUND

Typically, a memory controller may track memory access operations that have been performed on a memory media (e.g., the device or material on which the data is retained), and modify future memory access operations based on the record of the previous memory access operations. For example, by tracking the amount of time that has elapsed since a memory cell (e.g., a unit of the memory media capable of retaining a data value) was written to, the memory controller may adjust a reference voltage usable to determine whether a voltage at that memory cell is representative of a one or a zero (or other value) due to a drift (e.g., a gradual change) in the voltage over time. Similarly, the tracked memory accesses may be usable in performing wear leveling (e.g., distributing memory access operations across the available memory cells of the memory media) to reduce the likelihood that a subset of the available memory cells of the memory media will be used more, and thereby fail sooner, than other memory cells of the memory media.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
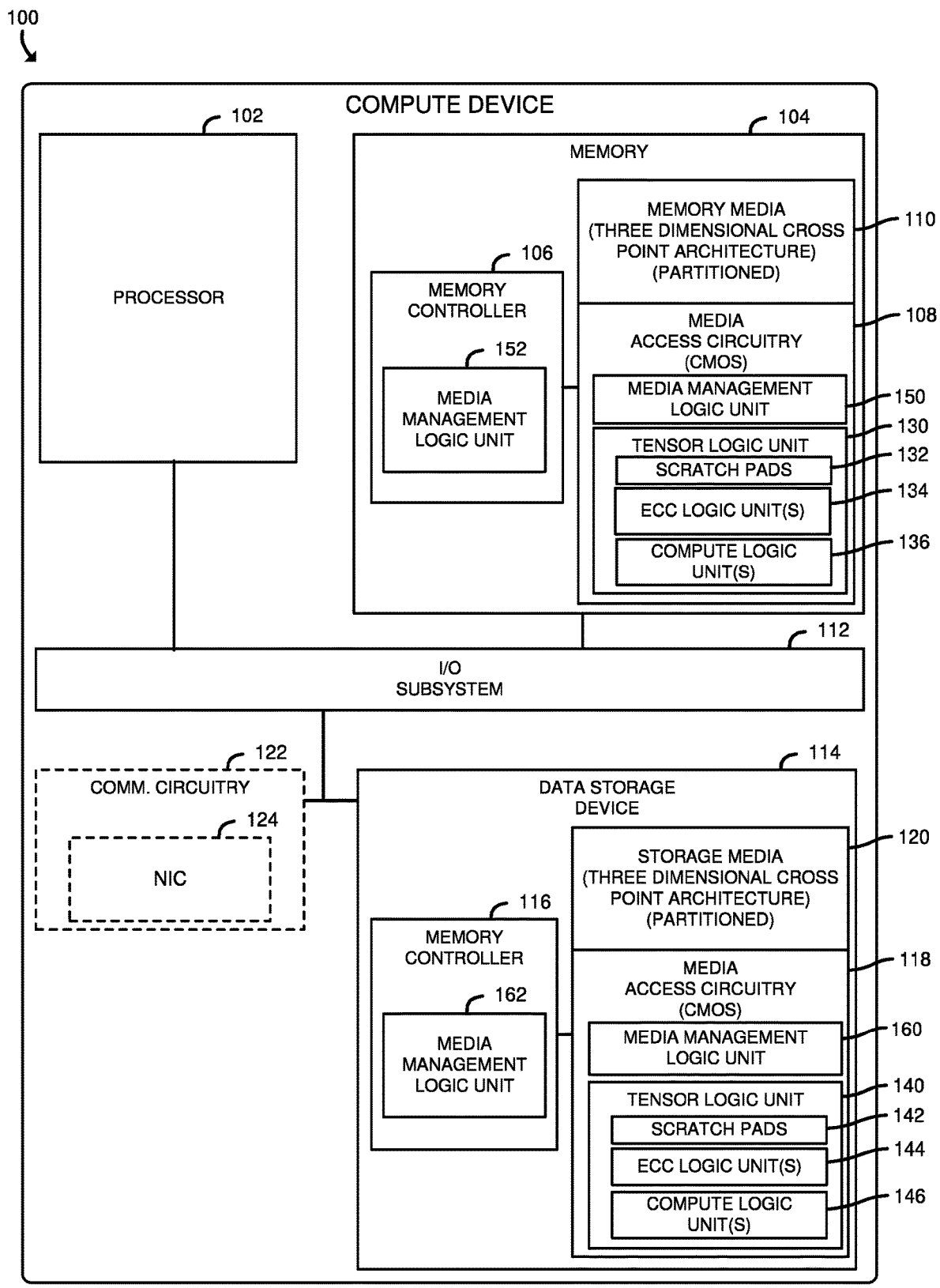
FIG. 1 is a simplified diagram of at least one embodiment of a compute device for providing adaptive memory media management.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a compute device 100 for providing adaptive memory media management includes a processor 102, memory 104, an input/output (I/O) subsystem 112, a data storage device 114, and communication circuitry 122. Of course, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. As explained in more detail herein, the media access circuitry 108, in the illustrative embodiment, is local to (e.g., on the same die, in the same package, etc.) the memory media 110 and may perform compute operations on data from the memory media 110, thereby eliminating the need for data to be sent (e.g., through a bus) to the processor 102 or another component of the compute device 100 for computations to be performed on the data. Additionally, the compute device 100, and in particular, the memory 104 of the compute device 100, selectively disables or enables management, by the memory controller 106 (e.g., by a media management logic unit 152, which may be embodied as any device or circuitry, such as reconfigurable circuitry, an application specific integrated circuit (ASIC), etc. configured to perform management of memory media), of memory access operations performed on the memory media 110. In particular, and as described in more detail herein, in performing compute operations on data in the memory media 110, the media access circuitry 108 may perform multiple reads and/or writes to the memory media 110. As such, rather than reporting each memory access operation to the memory controller 106 (e.g., through a bus that consumes time and energy to transmit data), management of the memory media 110 by the memory controller 106 is temporarily disabled and management of the memory access operations is performed by the media access circuitry 108 (e.g., by a media management logic unit 150, which may be embodied as any device or circuitry, such as reconfigurable circuitry, an application specific integrated circuit (ASIC), etc. configured to perform management of the memory media 110).

In the illustrative embodiment, when the memory access operations are complete (e.g., when the in-memory compute operation has finished), the media access circuitry 108 (e.g., the media management logic unit 150) re-enables the ability of the memory controller 106 (e.g., the media management logic unit 152) to manage (e.g., control the operations of) the memory media 110. The media access circuitry 108 (e.g., the media management logic unit 150) may also provide, to the memory controller 106, memory media usage data that is indicative of the memory access operations that were performed during the time the media access circuitry 108 (e.g., the media management logic unit 150) was exclusively managing the memory access operations and, as such, may be usable by memory controller 106 to perform wear leveling and/or to adjust a reference voltage used in determining the value, such as one or zero, at a particular memory cell in the memory media 110 in any subsequent memory access operations (i.e., operations that the memory controller 106 has not been prevented from managing). As compared to other systems, by performing the adaptive media management described above and in more detail below, the compute device 100 reduces energy use, improves bandwidth and latency for in-memory compute operations (e.g., matrix operations), and reduces the possibility that the memory controller 106 will inadvertently interrupt an on-going operation (e.g., by issuing a command that changes or stops an in-memory compute operation that the memory controller 106 was unaware of).

The memory media 110, in the illustrative embodiment, has a three-dimensional cross point architecture that has data access characteristics that differ from other memory architectures (e.g., dynamic random access memory (DRAM)), such as enabling access to one bit per tile and incurring time delays between reads or writes to the same partition or other partitions. The media access circuitry 108 is configured to make efficient use (e.g., in terms of power usage and speed) of the architecture of the memory media 110, such as by accessing multiple tiles in parallel within a given partition, utilizing scratch pads (e.g., relatively small, low latency memory) to temporarily retain and operate on data read from the memory media 110, and broadcasting data read from one partition to other portions of the memory 104 to enable matrix calculations (e.g., tensor operations) to be performed in parallel within the memory 104. Additionally, in the illustrative embodiment, instead of sending read or write requests to the memory 104 to access matrix data, the processor 102 may send a higher-level request (e.g., a type of matrix calculation to perform) and provide the locations and dimensions (e.g., in memory) of the matrices to be utilized in the requested operation (e.g., an input matrix, a weight matrix, and an output matrix). Further, rather than sending back the resulting data to the processor 102, the memory 104 may merely send back an acknowledgement (e.g., "Done"), indicating that the requested operation has been completed. As such, many compute operations, such as artificial intelligence operations (e.g., tensor operations involving matrix calculations) can be performed in memory 104, with minimal usage of the bus between the processor 102 and the memory 104. In some embodiments the media access circuitry 108 is included in the same die as the memory media 110. In other embodiments, the media access circuitry 108 is on a separate die but in the same package as the memory media 110. In yet other embodiments, the media access circuitry 108 is in a separate die and separate package but on the same dual in-line memory module (DIMM) or board as the memory media 110.

The processor 102 may be embodied as any device or circuitry (e.g., a multi-core processor(s), a microcontroller, or other processor or processing/controlling circuit) capable of performing operations described herein, such as executing an application (e.g., an artificial intelligence related application that may utilize a neural network or other machine learning structure to learn and make inferences). In some embodiments, the processor 102 may be embodied as, include, or be coupled to an FPGA, an application specific integrated circuit (ASIC), reconfigurable hardware or hardware circuitry, or other specialized hardware to facilitate performance of the functions described herein.

Figure 2:
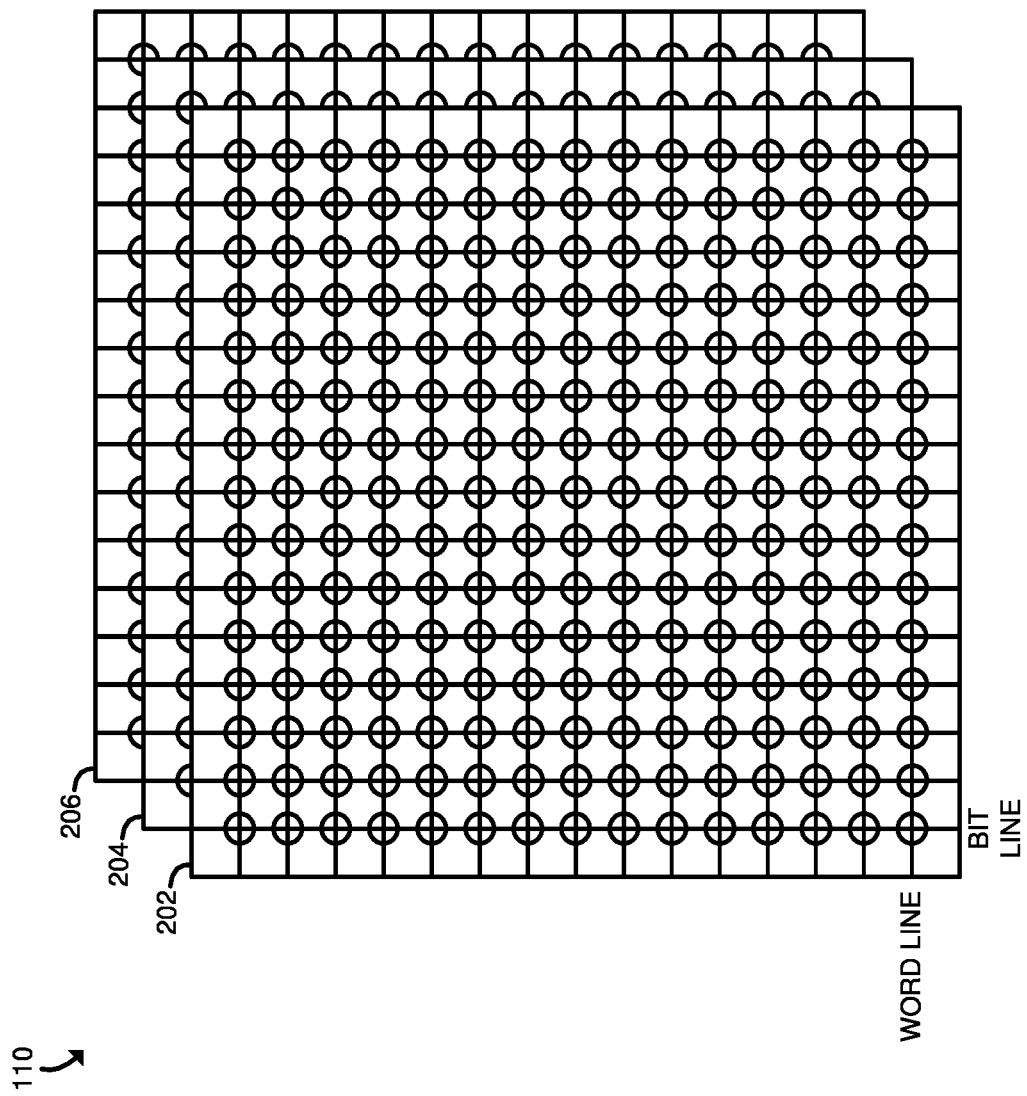
FIG. 2 is a simplified diagram of at least one embodiment of a memory media included in the compute device of FIG. 1.

The memory 104, which may include a non-volatile memory (e.g., a far memory in a two-level system main memory scheme), includes the memory media 110 and the media access circuitry 108 (e.g., a device or circuitry, such as integrated circuitry constructed from complementary metal-oxide-semiconductors (CMOS) or other materials) underneath (e.g., at a lower location) and coupled to the memory media 110. The media access circuitry 108 is also connected to the memory controller 106, which may be embodied as any device or circuitry (e.g., a processor, a co-processor, dedicated circuitry, etc.) configured to selectively read from and/or write to the memory media 110 in response to corresponding requests (e.g., from the processor 102 which may be executing an artificial intelligence related application that relies on tensor operations to train a neural network and/or to make inferences). Further, and as described above and in more detail below, the memory controller 106 may temporarily hand off management of memory access operations to the media access circuitry 108 (e.g., when the media access circuitry 108 is managing an in-memory compute operation). Referring briefly to FIG. 2, the memory media 110, in the illustrative embodiment, includes a tile architecture, also referred to herein as a cross point architecture (e.g., an architecture in which memory cells sit at the intersection of word lines and bit lines and are individually addressable and in which bit storage is based on a change in bulk resistance), in which each tile (e.g., memory cell) is addressable by an x parameter and a y parameter (e.g., a column and a row). The memory media 110 includes multiple partitions, each of which includes the tile architecture. The partitions may be stacked as layers 202, 204, 206 to form a three-dimensional cross point architecture (e.g., Intel 3D XPoint™ memory, Intel Optane™ memory, or QuantX™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

Referring back to FIG. 1, the media access circuitry 108, in the illustrative embodiment, includes a tensor logic unit 130, which may be embodied as any device or circuitry (e.g., CMOS circuitry) configured to offload the performance of tensor operations from other portions of the media access circuitry 108. The tensor logic unit 130, in the illustrative embodiment, includes multiple memory scratch pads 132, each of which may be embodied as any device or circuitry (e.g., static random access memories (SRAMs), register files, etc.) usable to provide relatively fast (e.g., low latency) access to data (e.g., matrix data) that has been read from the memory media 110. In the illustrative embodiment, the scratch pads 132 provide faster read and write access times than the memory media 110 which has comparatively slower access times and a larger capacity. The tensor logic unit 130 may also include an error correction code (ECC) logic unit 134, which may be embodied as any device or circuitry (e.g., reconfigurable circuitry, an ASIC, etc.) configured to perform an error correction algorithm (e.g., a Reed-Solomon algorithm, a Bose-Chaudhuri-Hocquenghem (BCH) algorithm, etc.) on data written to and read from the memory media 110 to detect and correct any errors (e.g., due to corruption). Additionally, in the illustrative embodiment, the tensor logic unit 130 includes multiple compute logic units 136 each of which may be embodied as any device or circuitry (e.g., reconfigurable circuitry, ASICs, etc.) configured to perform compute operations on data read from the memory media 110 (e.g., after the ECC logic unit 134 has performed an error correction process on the data).

Figure 3:
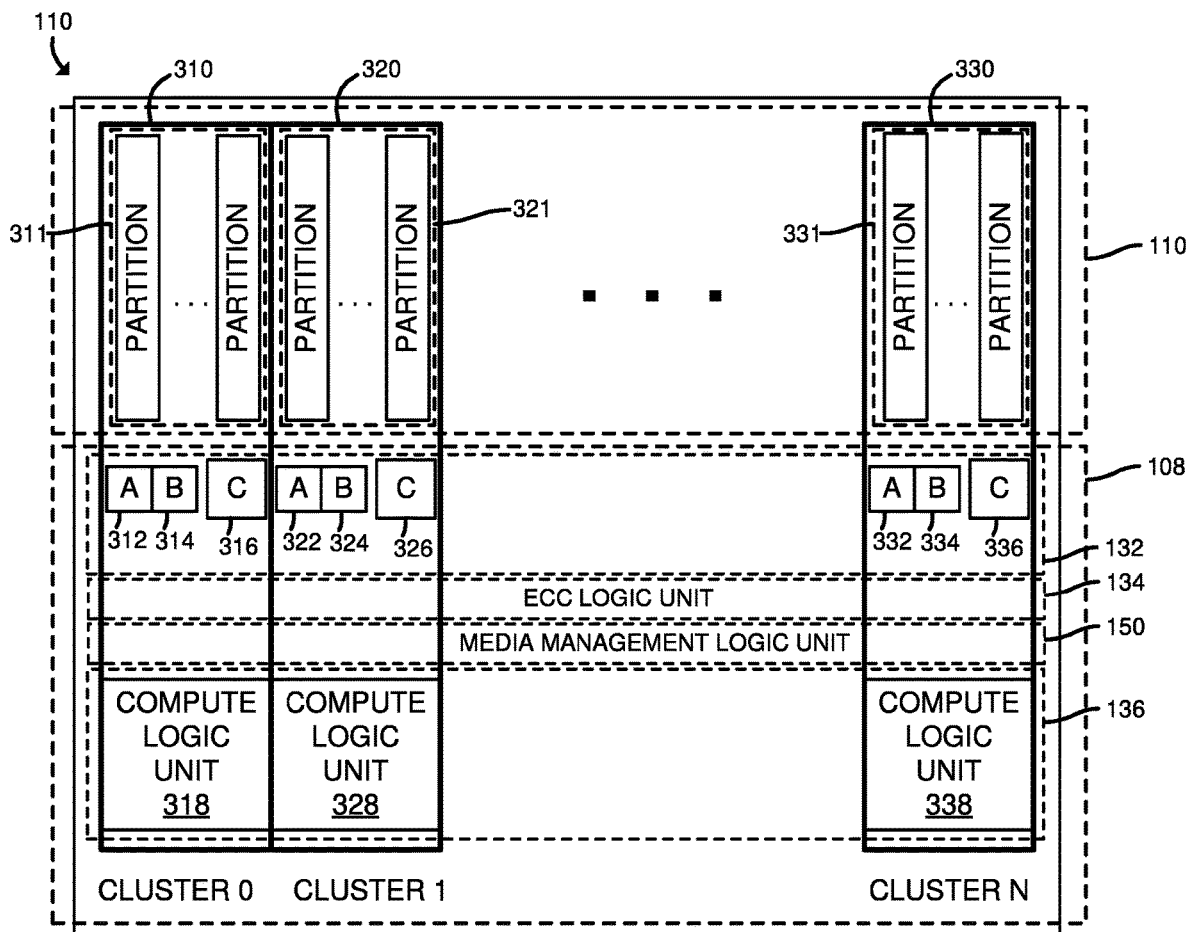
FIG. 3 is a simplified diagram of at least one embodiment of partitions of the memory media and components of a media access circuitry of a memory included in the compute device of FIG. 1.

Referring briefly to FIG. 3, in the illustrative embodiment, components of the memory 104 are divided into clusters 310, 320, 330 (e.g., groupings of components). The cluster 310 includes multiple partitions 311 of the memory media 110, a set of scratch pads 312, 314, 316, each similar to the scratch pads 132 of FIG. 1, and a corresponding compute logic unit 318, similar to the compute logic unit 136 of FIG. 1. Similarly, the cluster 320 includes another set of partitions 321 of the memory media 110, a corresponding set of scratch pads 322, 324, 326, and a corresponding compute logic unit 328. The cluster 330 also includes a set of partitions 331 of the memory media 110, a corresponding set of scratch pads 332, 334, 336, and a compute logic unit 338. In the illustrative embodiment, in operation, the compute logic unit 318 reads a subset of matrix data (e.g., one value of an input matrix A from the set of partitions (e.g., partitions 311)) and provides the read data to the ECC logic unit 134 to perform an error correction process to correct any errors in the data. The compute logic unit 318 may additionally write the data (e.g., after the error correction process has been performed) into the corresponding scratch pad 312 and may broadcast that same subset of the matrix data to the corresponding scratch pads of the other clusters (e.g., to the scratch pads 322, 332). Similarly, the compute logic unit 328 may read, from the corresponding set of partitions 321 another subset of the matrix data (e.g., another value of the input matrix A) into the corresponding scratch pad 322, utilizing the ECC logic unit 134 to correct any errors, and broadcast that subset of the matrix data to the other scratch pads that are to store data for that matrix (e.g., to the scratch pads 312, 332). The compute logic unit 338 may perform similar operations.

By broadcasting, to the other scratch pads, matrix data that has been read from a corresponding set of partitions of the memory media 110, the media access circuitry 108 reduces the number of times that a given section (e.g., set of partitions) of the memory media 110 must be accessed to obtain the same matrix data (e.g., the read matrix data may be broadcast to multiple scratch pads after being read from the memory media 110 once, rather than reading the same matrix data from the memory media 110 multiple times). Further, by utilizing multiple compute logic units 318, 328, 338 that are each associated with corresponding scratch pads 312, 314, 316, 322, 224, 226, 232, 234, 236, the media access circuitry 108 may perform the portions of a tensor operation (e.g., matrix multiply and accumulate) concurrently (e.g., in parallel). It should be understood that while three clusters 310, 320, 330 are shown in FIG. 3 for simplicity, the actual number of clusters and corresponding partitions, scratch pads, and compute logic units may differ depending on the particular embodiment.

Figure 4:
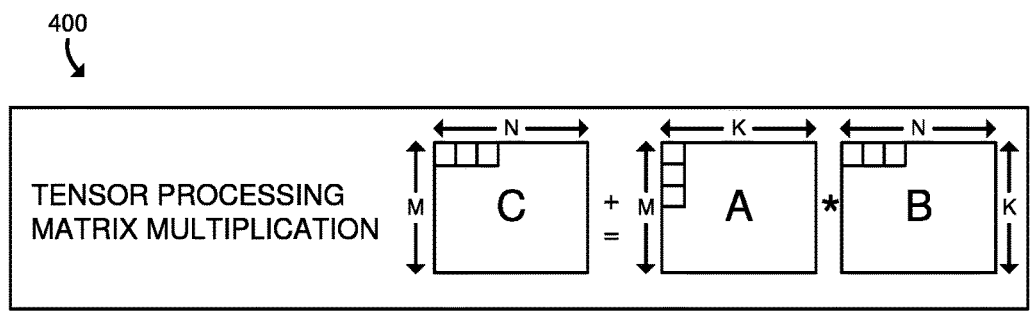
FIG. 4 is a simplified diagram of at least one embodiment of a tensor operation that may be performed in the memory of the compute device of FIG. 1.

Referring briefly to FIG. 4, an example of a matrix multiplication (e.g., matrix multiply and accumulate) operation 400 that may be performed by the memory 104 is shown. As illustrated, matrix data in an input matrix A is multiplied by matrix data in another matrix B (e.g., weight data for a layer of a convolutional neural network) and the resultant data is written to the output matrix C. Each matrix represented in FIG. 4 is temporarily stored as matrix data in the scratch pads 132 of the media access circuitry 108. In some embodiments, the output matrix C may be utilized as an input matrix for a subsequent tensor operation (e.g., as an input matrix for a subsequent layer of a convolutional neural network).

Referring back to FIG. 1, the memory 104 may include non-volatile memory and volatile memory. The non-volatile memory may be embodied as any type of data storage capable of storing data in a persistent manner (even if power is interrupted to the non-volatile memory). For example, the non-volatile memory may be embodied as one or more non-volatile memory devices. The non-volatile memory devices may include one or more memory devices configured in a cross point architecture that enables bit-level addressability (e.g., the ability to read from and/or write to individual bits of data, rather than bytes or other larger units of data), and are illustratively embodied as three-dimensional (3D) cross point memory. In some embodiments, the non-volatile memory may additionally include other types of memory, including any combination of memory devices that use chalcogenide phase change material (e.g., chalcogenide glass), ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM. The volatile memory may be embodied as any type of data storage capable of storing data while power is supplied volatile memory. For example, the volatile memory may be embodied as one or more volatile memory devices, and is periodically referred to hereinafter as volatile memory with the understanding that the volatile memory may be embodied as other types of non-persistent data storage in other embodiments. The volatile memory may have an architecture that enables bit-level addressability, similar to the architecture described above.

The processor 102 and the memory 104 are communicatively coupled to other components of the compute device 100 via the I/O subsystem 112, which may be embodied as circuitry and/or components to facilitate input/output operations with the processor 102 and/or the main memory 104 and other components of the compute device 100. For example, the I/O subsystem 112 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate input/output operations. In some embodiments, the I/O subsystem 112 may form a portion of a system-on-a-chip (SoC) and be incorporated, along with one or more of the processor 102, the main memory 104, and other components of the compute device 100, in a single chip.

The data storage device 114 may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, a media management logic unit 162, similar to the media management logic unit 152, storage media 120, similar to the memory media 110, and media access circuitry 118, similar to the media access circuitry 108, including a tensor logic unit 140, similar to the tensor logic unit 130, scratch pads 142, similar to the scratch pads 132, an ECC logic unit 144, similar to the ECC logic unit 134, compute logic units 146, similar to the compute logic units 136, and a media management logic unit 160, similar to the media management logic unit 150. As such, the data storage device 114 is capable of selectively disabling or enabling management, by the memory controller 116, of memory access operations and handing off exclusive management of the memory access operations to the media access circuitry, such as during an in-memory compute operation (e.g., a matrix operation performed in the media access circuitry 118 on data in the storage media 120). The data storage device 114 may include a system partition that stores data and firmware code for the data storage device 114 and one or more operating system partitions that store data files and executables for operating systems.

The communication circuitry 122 may be embodied as any communication circuit, device, or collection thereof, capable of enabling communications over a network between the compute device 100 and another device. The communication circuitry 122 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 122 includes a network interface controller (NIC) 124, which may also be referred to as a host fabric interface (HFI). The NIC 124 may be embodied as one or more add-in-boards, daughter cards, network interface cards, controller chips, chipsets, or other devices that may be used by the compute device 100 to connect with another compute device. In some embodiments, the NIC 124 may be embodied as part of a system-on-a-chip (SoC) that includes one or more processors, or included on a multichip package that also contains one or more processors. In some embodiments, the NIC 124 may include a local processor (not shown) and/or a local memory (not shown) that are both local to the NIC 124. In such embodiments, the local processor of the NIC 124 may be capable of performing one or more of the functions of the processor 102. Additionally or alternatively, in such embodiments, the local memory of the NIC 124 may be integrated into one or more components of the compute device 100 at the board level, socket level, chip level, and/or other levels.

Figure 5:
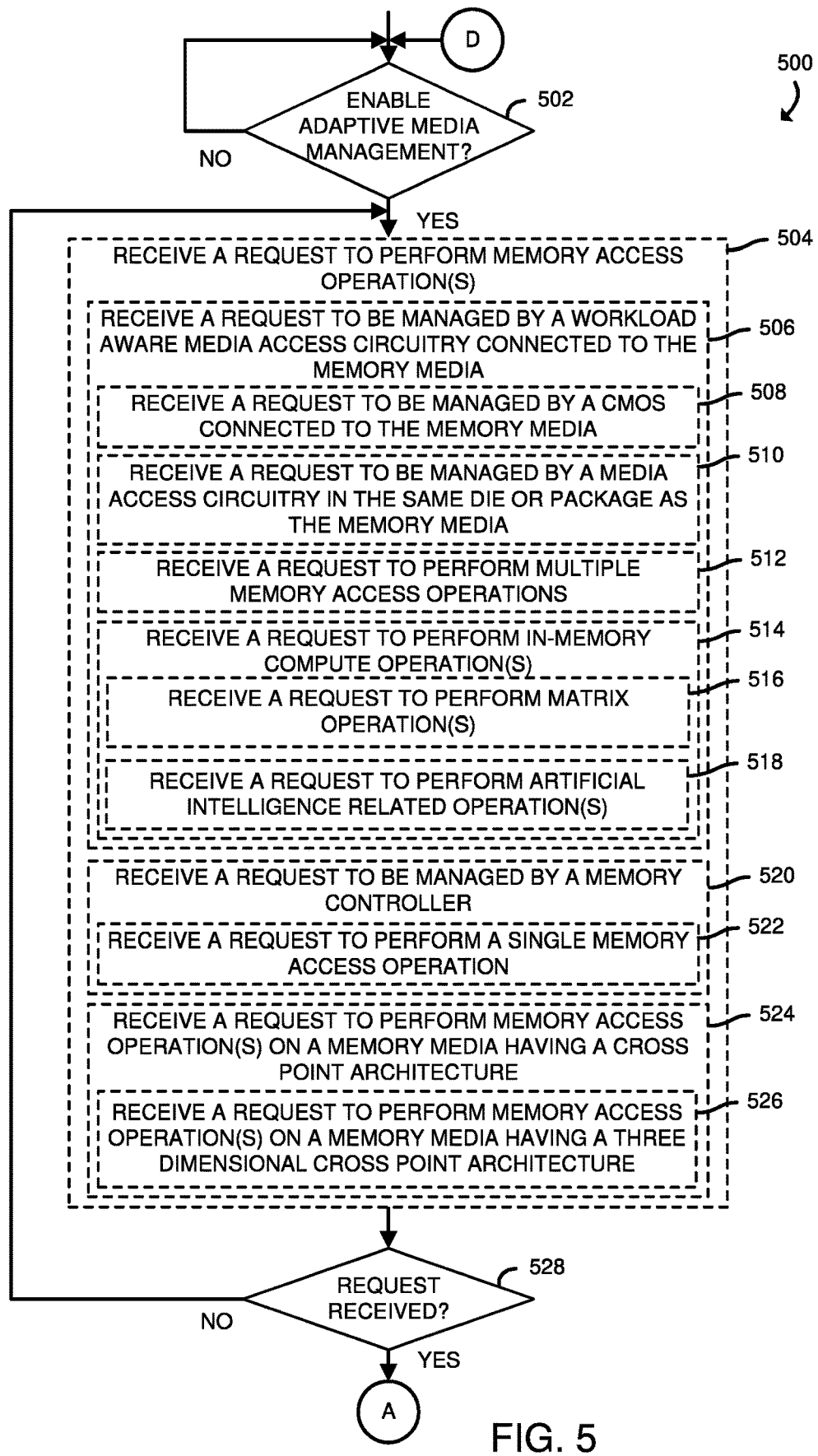
FIGS. 5-7 are simplified diagrams of at least one embodiment of a method for providing adaptive memory media management may be performed by the compute device of FIG. 1.

Referring now to FIG. 5, the compute device 100, in operation, may execute a method 500 for providing adaptive memory media management. The method 500 is described with reference to the memory 104. However, it should be understood that the method 500 could be additionally or alternatively performed using the memory of the data storage device 114. The method 500 begins with block 502 in which the compute device 100 (e.g., the memory 104) determines whether to enable adaptive memory media management. The compute device 100 may enable adaptive memory media management in response to a determination that a configuration setting (e.g., in a configuration file) indicates to enable adaptive memory media management, in response to a determination that media management logic units 150, 152 are present, and/or based on other factors. Regardless, in response to a determination to enable adaptive memory media management, the method 500 advances to block 504, in which the compute device 100 (e.g., the memory 104) may receive a request to perform one or more memory access operations (e.g., from the processor 102 executing an application). As indicated in block 506, the memory 104 may receive a request to be managed by a workload aware media access circuitry (e.g., the media access circuitry 108) connected to the memory media 110. The media access circuitry 108 is workload aware because it is integral to (e.g., coordinates and utilizes components of the media access circuitry 108 to perform) in-memory compute operations that may be performed in association with a workload (e.g., the application executed by the processor 102). As indicated in block 508, the request may be a request to be managed by a complementary metal-oxide semiconductor (CMOS) connected to the memory media 110 (e.g., to be managed by the media access circuitry 108, which may be formed from a CMOS). The request may be a request to be managed by a media access circuitry located in the same die (e.g., semiconductor die) or package (e.g., semiconductor package) as the memory media 110 (e.g., to be managed by the media access circuitry 108, which may be integrated into the same die or the same package as the memory media 110), as indicated in block 510.

In some embodiments, the request is a request to perform multiple memory access operations (e.g., multiple writes, multiple reads, etc.), as indicated in block 512. As indicated in block 514, the request may be a request to perform one or more in-memory compute operations. For example, and as indicated in block 516, the request may be to perform one or more matrix operations (e.g., a matrix multiplication operation similar to the operation 400 of FIG. 4). As indicated in block 518, the request may be to perform one or more artificial intelligence operations (e.g., operations relating to training a neural network, producing an inference with a neural network, etc.). Alternatively, the request may be a request that is to be managed by the memory controller 106, as indicated in block 520 (e.g., the request does not require an awareness of multiple read and/or write operations performed within the memory 104). For example, and as indicated in block 522, the request may be to perform a single memory access operation (e.g., to write data or to read data). In the illustrative embodiment, and as indicated in block 524, the request is a request to perform one or more memory access operations on a memory media having a cross point architecture (e.g., an architecture in which memory cells sit at the intersection of word lines and bit lines and are individually addressable and in which bit storage is based on a change in bulk resistance). Further, and as indicated in block 526, the request may be a request to perform one or more media access operations on a memory media having a three dimensional cross point architecture (e.g., an architecture in which sets of tiles are stacked as layers, as described with reference to FIG. 2). In other embodiments, the request may be to perform the memory access operations on a memory media having a different architecture. In block 528, the compute device 100 (e.g., the memory 104) determines the subsequent course of action based on whether a request to perform one or more memory operations was received. If not, the method 500 loops back to block 504 to potentially receive a request to perform one or more memory access operations. Otherwise (e.g., if a request was received), the method 500 advances to block 530 of FIG. 6, in which the compute device 100 (e.g., the memory 104) determines the subsequent course of action based on whether the received request is to be managed by a workload aware media access circuitry (e.g., the media access circuitry 108) or not.

Figure 6:
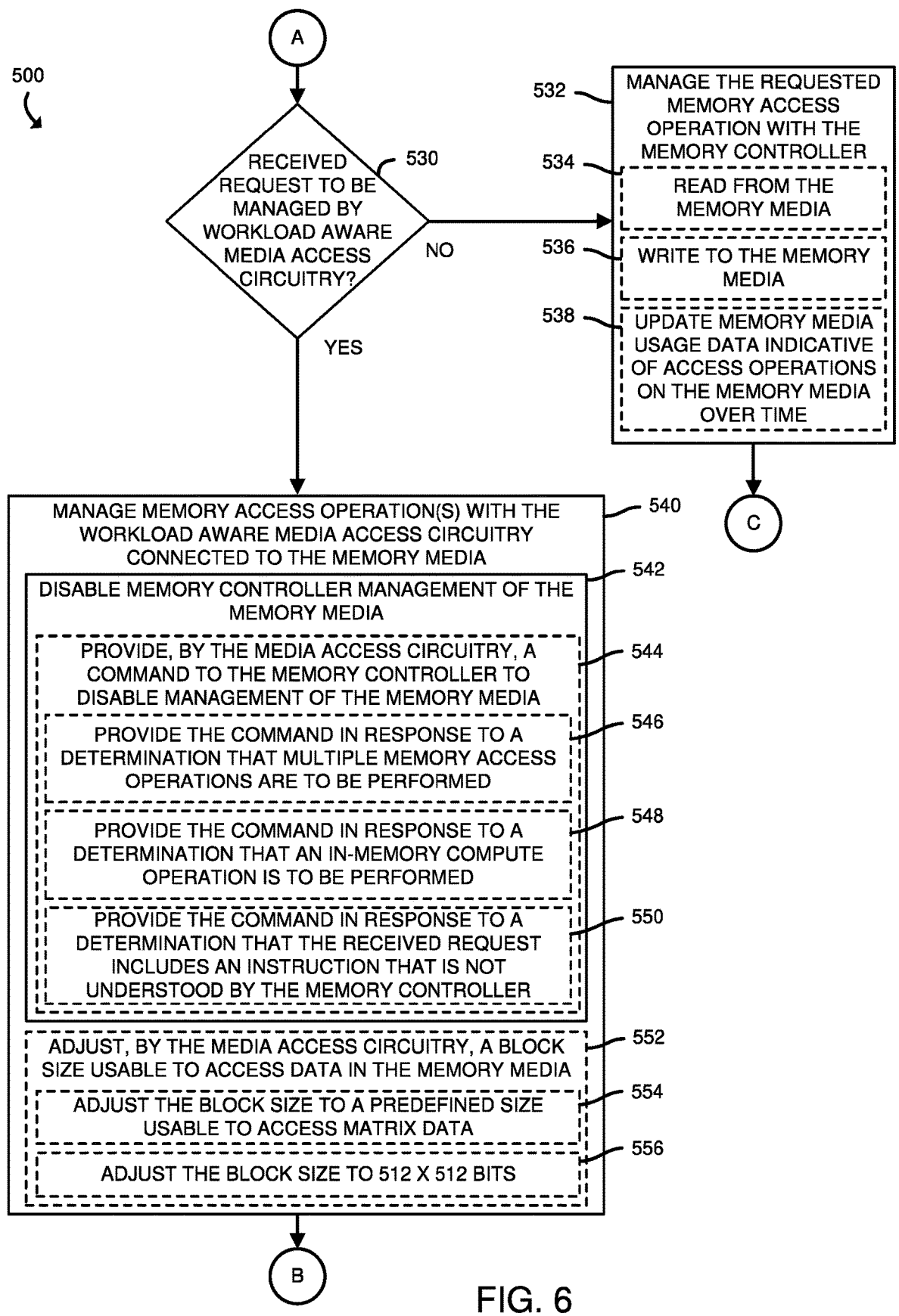

Referring now to FIG. 6, if the request is not to be managed by the workload aware media access circuitry (e.g., the media access circuitry 108), the method 500 advances to block 532, in which the compute device 100 manages the requested memory access operation with the memory controller 106. In doing so, and as indicated in block 534, the compute device 100 may read from the memory media as indicated in block 534. Alternatively, the compute device 100 may write to the memory media 110, as indicated in block 536. As indicated in block 538, the compute device 100 (e.g., the memory controller 106) may update memory media usage data, which may be embodied as any data indicative of access operations that have been performed on the memory media 110 over time. In doing so, the memory controller 106 may write, to the memory media usage data, a record of the memory access operation that was just performed, including the memory cell(s) that were accessed, a timestamp of when the memory access operation occurred, and the type of access operation that was performed (e.g., read or write).

Referring back to block 530, if the request is instead to be managed by workload aware media access circuitry, the method 500 advances to block 540, in which the compute device 100 (e.g., the media access circuitry 108) manages the requested memory access operation(s). In doing so, and as indicated in block 542, the media access circuitry 108 disables memory controller management of the memory media (e.g., prevents the memory controller 106 from issuing commands that may interrupt the requested memory operation(s), prevents data, such as notifications of completions of operations and/or other status data, from being reported from the memory media 110 and/or the media access circuitry 108 to the memory controller 106, etc.). As indicated in block 544, the media access circuitry 108 may disable the memory controller management of the memory media 110 by providing a command to the memory controller to disable management of the memory media. As indicated in block 546, the media access circuitry 108 may provide the command in response to a determination that multiple memory access operations are to be performed (e.g., the media access circuitry 108 is to manage the request because multiple memory access operations to be performed in association with the request). In some embodiments, the media access circuitry 108 may provide the command to the memory controller 106 in response to a determination that an in-memory compute operation is to be performed (e.g., the request is to be managed by the media access circuitry 108 because the request is to perform an in-memory compute operation), as indicated in block 548. As another example, the media access circuitry 108 may provide the command to the memory controller 106 in response to a determination that the received request includes an instruction that was not understood by (e.g., not within an instruction set of) the memory controller 106 (e.g., the memory controller 106 may pass the request on to the media access circuitry 108 with data indicating that the request was not understood by the memory controller 106), as indicated in block 550. For example, a specific type of in-memory compute operation indicated in the request may be within the instruction set of the media access circuitry 108 but not within the instruction set of the memory controller 106. As indicated in block 552, the media access circuitry 108 may additionally adjust a block size (e.g., from a default size that is typically used) that is usable to access data in the memory media 110. In doing so, and as indicated in block 554, the media access circuitry 108 may adjust the block size to a predefined size that is usable for accessing matrix data. For example, the media access circuitry 108 may adjust the block size to 512×512 bits, as indicated in block 556.

Figure 7:
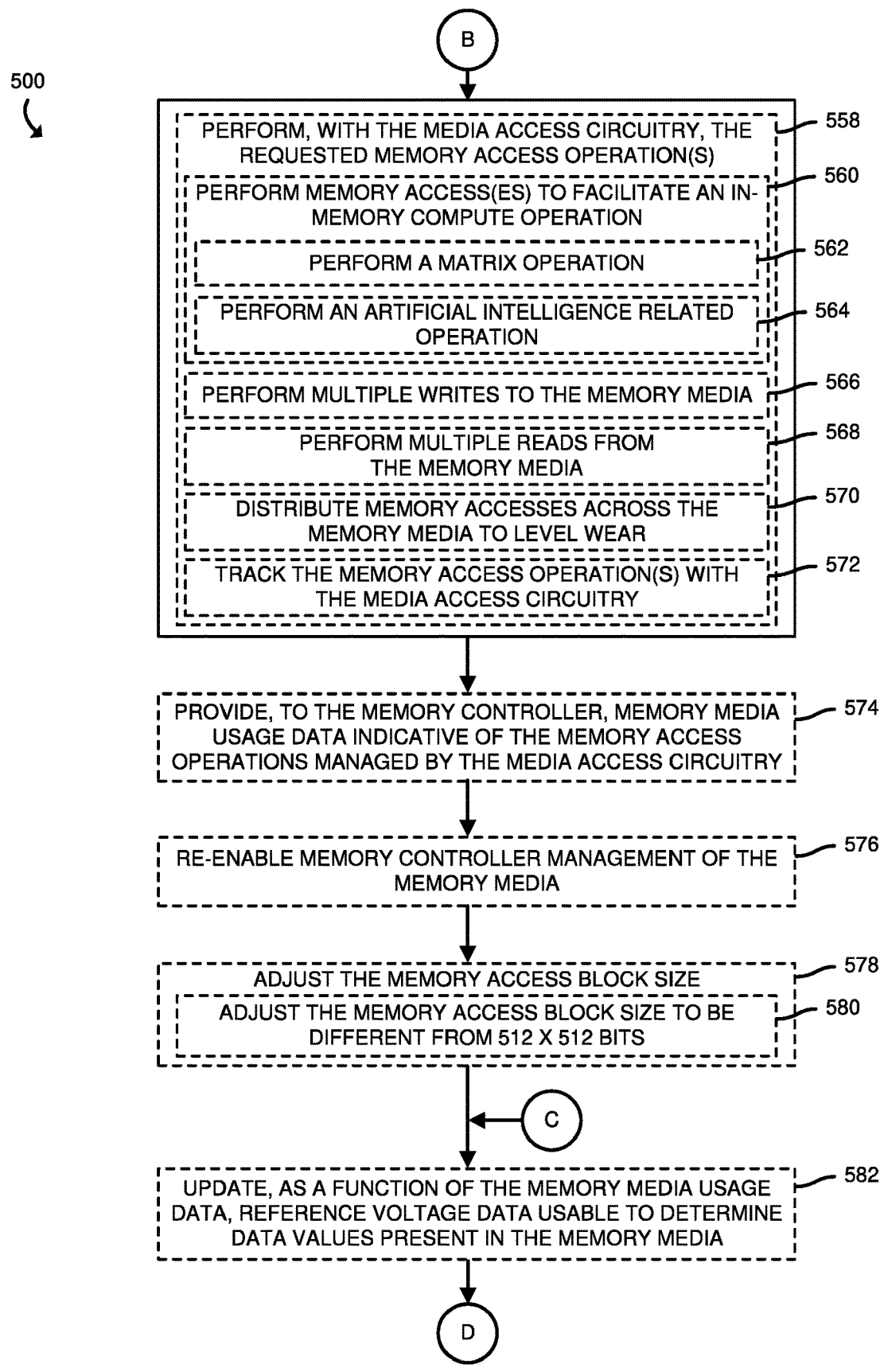

Referring now to FIG. 7, the media access circuitry 108, in managing the requested memory access operation(s), performs the requested memory access operation(s), as indicated in block 558. In doing so, and as indicated in block 560, the media access circuitry 108 may perform memory access operations to facilitate an in-memory compute operation. For example, and as indicated in block 562, the media access circuitry 108 may perform memory access operations to facilitate a matrix operation (e.g., a matrix multiplication operation, similar to the operation 400 of FIG. 4), such as reading matrix elements, multiplying them, and writing a result back to the memory media 110 one or more times. As indicated in block 564, the media access circuitry 108 may perform the memory access operations during the performance of an artificial intelligence related operation (e.g., training a neural network, producing an inference with a neural network, etc.). As indicated in block 566, the media access circuitry 108 may perform multiple writes to the memory media 110. Additionally or alternatively, and as indicated in block 568, the media access circuitry 108 may perform multiple reads from the memory media 110. Further, in performing the memory access operations, the media access circuitry 108 may distribute memory accesses (e.g., writes and reads) across the memory media 110 to level the wear on the memory cells (e.g., to avoid using the same memory cells repeatedly, causing those memory cells to fail faster than other memory cells in the memory media), as indicated in block 570. As indicated in block 572, the media access circuitry 108, in the illustrative embodiment, tracks the memory access operation(s) (e.g., updates memory media usage data using a process similar to that described with reference to block 538 of FIG. 6).

Subsequently (e.g., after the requested memory access operations have been completed), the media access circuitry 108, in the illustrative embodiment, provides, to the memory controller 106, memory media usage data indicative of the memory access operations that were managed by the media access circuitry 108 (e.g., the memory access operations tracked in block 572), as indicated in block 574. Further, and as indicated in block 576, the media access circuitry 108, in the illustrative embodiment, re-enables memory controller management of the memory media 110 (e.g., by sending an instruction to the memory controller 106 to re-enable management of the memory media 110, etc.). As indicated in block 578, the media access circuitry 108 may adjust the memory access block size. For example, and as indicated in block 580, the media access circuitry 108 may adjust the memory access block size to be different from 512×512 bits. After the media access circuitry 108 has performed block 578, or after the memory controller 106 has performed block 532, the method 500 may proceed to block 582, in which the memory 104 updates, as a function of the memory media usage data, reference voltage data usable to determine data values present in the memory media (e.g., by accounting for the amount of time that has elapsed since a value was written to a given memory cell and the rate at which the voltage drifts from its initial voltage). Subsequently, the method 500 loops back to block 502 of FIG. 5 in which the compute device 100 determines whether to continue to enable adaptive media management.

EXAMPLES

Illustrative examples of the technologies disclosed herein are provided below. An embodiment of the technologies may include any one or more, and any combination of, the examples described below.

Example 1 includes a memory comprising media access circuitry connected to a memory media, wherein the media access circuitry is to receive a request to perform at least one memory access operation to be managed by the media access circuitry; and manage the requested at least one memory access operation, including disabling a memory controller in communication with the media access circuitry from managing the memory media while the at least one requested memory access operation is performed.

Example 2 includes the subject matter of Example 1, and wherein the media access circuitry is further to re-enable memory controller management of the memory media after the at least one memory access operation has been performed.

Example 3 includes the subject matter of any of Examples 1 and 2, and wherein to manage the requested at least one memory access operation comprises to track, with the media access circuitry, the at least one memory access operation; and the media access circuitry is further to provide, to the memory controller and after the at least one memory access operation has been performed, memory media usage data indicative of the memory access operations that were managed by the media access circuitry.

Example 4 includes the subject matter of any of Examples 1-3, and wherein the media access circuitry is further to update, as a function of the memory media usage data, reference voltage data usable to determine data values present in the memory media.

Example 5 includes the subject matter of any of Examples 1-4, and wherein to manage the requested at least one memory access operation comprises to adjust a block size usable to access data in the memory media.

Example 6 includes the subject matter of any of Examples 1-5, and wherein to adjust the block size comprises to adjust the block size to a predefined size usable to access matrix data.

Example 7 includes the subject matter of any of Examples 1-6, and wherein the media access circuitry is further to re-adjust the block size after the at least one memory access operation has been performed.

Example 8 includes the subject matter of any of Examples 1-7, and wherein to receive a request to perform at least one memory access operation to be managed by the media access circuitry comprises to receive a request to perform multiple memory access operations.

Example 9 includes the subject matter of any of Examples 1-8, and wherein to receive a request to perform at least one memory access operation to be managed by the media access circuitry comprises to receive a request to perform at least one in-memory compute operation.

Example 10 includes the subject matter of any of Examples 1-9, and wherein to receive a request to perform at least one memory access operation to be managed by the media access circuitry comprises to receive a request to perform one or more matrix operations.

Example 11 includes the subject matter of any of Examples 1-10, and wherein to receive a request to perform at least one memory access operation to be managed by the media access circuitry comprises to receive a request to perform one or more artificial intelligence operations.

Example 12 includes the subject matter of any of Examples 1-11, and wherein the media access circuitry is formed from a complementary metal-oxide-semiconductor.

Example 13 includes the subject matter of any of Examples 1-12, and wherein the memory media has a cross point architecture.

Example 14 includes the subject matter of any of Examples 1-13, and wherein the memory media has a three dimensional cross point architecture.

Example 15 includes a method comprising receiving, by a media access circuitry connected to a memory media, a request to perform at least one memory access operation to be managed by the media access circuitry; and managing, by the media access circuitry, the requested at least one memory access operation, including disabling a memory controller in communication with the media access circuitry from managing the memory media while the at least one requested memory access operation is performed.

Example 16 includes the subject matter of Example 15, and further including re-enabling, by the media access circuitry, memory controller management of the memory media after the at least one memory access operation has been performed.

Example 17 includes the subject matter of any of Examples 15 and 16, and wherein managing the requested at least one memory access operation comprises tracking, with the media access circuitry, the at least one memory access operation; the method further comprising providing, to the memory controller and after the at least one memory access operation has been performed, memory media usage data indicative of the memory access operations that were managed by the media access circuitry.

Example 18 includes the subject matter of any of Examples 15-17, and further including updating, by the media access circuitry and as a function of the memory media usage data, reference voltage data usable to determine data values present in the memory media.

Example 19 includes one or more machine-readable storage media comprising a plurality of instructions stored thereon that, in response to being executed, cause media access circuitry connected to a memory media to receive a request to perform at least one memory access operation to be managed by the media access circuitry; and manage the requested at least one memory access operation, including disabling a memory controller in communication with the media access circuitry from managing the memory media while the at least one requested memory access operation is performed.

Example 20 includes the subject matter of Example 19, and wherein the instructions further cause the media access circuitry to re-enable memory controller management of the memory media after the at least one memory access operation has been performed.

The invention claimed is:
1. A memory device comprising:
   a memory controller;
   a memory media; and
   media access circuitry communicatively coupled with the memory controller and the memory media, the media access circuitry to include logic to:
      receive a request to perform at least one memory access operation that is to be managed by the media access circuitry; and manage the requested at least one memory access operation to include the logic to cause the memory controller to be disabled from managing the memory media while the at least one requested memory access operation is performed by the media access circuitry, and adjust a memory access block size to a first memory access block size that is used to access matrix data maintained in the memory media while the at least one requested memory access operation is performed.

2. The memory device of claim 1, further comprising the logic to re-enable memory controller management of the memory media after the at least one memory access operation has been performed.

3. The memory device of claim 1, wherein to manage the requested at least one memory access operation further comprises the logic to:

track the at least one memory access operation; and provide, to the memory controller and after the at least one memory access operation has been performed, memory media usage data indicative of the memory access operations that were managed by the media access circuitry.

4. The memory device of claim 3, wherein the logic is further to update, as a function of the memory media usage data, reference voltage data usable to determine data values present in the memory media.

5. The memory device of claim 1, further comprising the logic to adjust the first memory access block size to a second memory access block size that is used to access matrix data maintain in the memory media after the at least one memory access operation has been performed.

6. The memory device of claim 1, wherein to receive a request to perform at least one memory access operation to be managed by the media access circuitry comprises the logic to receive a request to perform multiple memory access operations.

7. The memory device of claim 1, wherein to receive a request to perform at least one memory access operation to be managed by the media access circuitry comprises the logic to receive a request to perform at least one in-memory compute operation.

8. The memory device of claim 7, wherein to receive a request to perform at least one memory access operation to be managed by the media access circuitry comprises the logic to receive a request to perform one or more artificial intelligence operations using the accessed matrix data.

9. The memory device of claim 1, wherein the media access circuitry is formed from a complementary metal-oxide-semiconductor.

10. The memory device of claim 1, wherein the memory media has a cross point architecture.

11. The memory device of claim 10, wherein the memory media has a three dimensional cross point architecture.

12. A method implemented at a memory device, the method comprising:

receiving, by media access circuitry communicatively coupled with a memory controller and a memory media, a request to perform at least one memory access operation that is to be managed by the media access circuitry; and managing the requested at least one memory access operation to include causing the memory controller to be disabled from managing the memory media while the at least one requested memory access operation is performed by the media access circuitry and adjusting a memory access block size to a first memory access block size that is used to access matrix data maintained in the memory media while the at least one requested memory access operation is performed.

13. The method of claim 12, further comprising re-enabling, by the media access circuitry, memory controller management of the memory media after the at least one memory access operation has been performed.

14. The method of claim 12, wherein managing the requested at least one memory access operation further comprises:

tracking the at least one memory access operation; and providing, to the memory controller and after the at least one memory access operation has been performed, memory media usage data indicative of the memory access operations that were managed by the media access circuitry.

15. The method of claim 14, further comprising updating, by the media access circuitry and as a function of the memory media usage data, reference voltage data usable to determine data values present in the memory media.

16. One or more non-transitory machine-readable storage media comprising a plurality of instructions stored thereon that, in response to being executed, cause media access circuitry communicatively coupled with a memory controller and a memory media to:

receive a request to perform at least one memory access operation that is to be managed by the media access circuitry; and manage the requested at least one memory access operation to include causing the memory controller to be disabled from managing the memory media while the at least one requested memory access operation is performed by the media access circuitry and adjusting a memory access block size to a first memory access block size that is used to access matrix data maintained in the memory media while the at least one requested memory access operation is performed.

17. The one or more non-transitory machine-readable storage media of claim 16, wherein the instructions further cause the media access circuitry to re-enable memory controller management of the memory media after the at least one memory access operation has been performed.

18. The one or more non-transitory machine-readable storage media of claim 16, wherein to receive a request to perform at least one memory access operation to be managed by the media access circuitry comprises to receive a request to perform multiple memory access operations.

19. The one or more non-transitory machine-readable storage media of claim 16, wherein to receive a request to perform at least one memory access operation to be managed by the media access circuitry comprises to receive a request to perform at least one in-memory compute operation.

20. The one or more non-transitory machine-readable storage media of claim 16, wherein to receive a request to perform at least one memory access operation to be managed by the media access circuitry comprises to receive a request to perform one or more artificial intelligence operations using the accessed matrix data.

* * * * *